(12) United States Patent
Ono et al.

(10) Patent No.: US 12,311,760 B2
(45) Date of Patent: May 27, 2025

(54) GLASS SUBSTRATE

(71) Applicant: AGC Inc., Tokyo (JP)

(72) Inventors: Takeaki Ono, Tokyo (JP); Koki Moriya, Tokyo (JP); Toru Ikeda, Tokyo (JP); Kensuke Fujii, Tokyo (JP)

(73) Assignee: AGC INC., Tokyo (JP)

( * ) Notice: Subject to any disclaimer, the term of this patent is extended or adjusted under 35 U.S.C. 154(b) by 491 days.

(21) Appl. No.: 17/544,753

(22) Filed: Dec. 7, 2021

(65) Prior Publication Data

US 2022/0089026 A1 Mar. 24, 2022

Related U.S. Application Data

(63) Continuation of application No. PCT/JP2020/023442, filed on Jun. 15, 2020.

(30) Foreign Application Priority Data

Jun. 19, 2019 (JP) ................. 2019-113466

(51) Int. Cl.
*B60K 35/00* (2024.01)
*B60K 35/22* (2024.01)
(Continued)

(52) U.S. Cl.
CPC .............. *B60K 35/00* (2013.01); *C03C 17/34* (2013.01); *H05K 5/03* (2013.01); *B60K 35/22* (2024.01);
(Continued)

(58) Field of Classification Search
CPC .. B60K 35/00; B60K 2370/152; C03C 17/34; C03C 21/002; C03C 2217/73; H05K 5/03
See application file for complete search history.

(56) References Cited

U.S. PATENT DOCUMENTS

2018/0052254 A1 2/2018 Takai et al.
2018/0059454 A1* 3/2018 Shin ................ G02F 1/1345
(Continued)

FOREIGN PATENT DOCUMENTS

EP  3 290 998 B1  3/2018
JP  2018-037084 A  3/2018
(Continued)

OTHER PUBLICATIONS

Machine Translation of WO 2018/117078 A1 (Year: 2018).*
(Continued)

*Primary Examiner* — Gerard Higgins
*Assistant Examiner* — Sathavaram I Reddy
(74) *Attorney, Agent, or Firm* — Foley & Lardner LLP

(57) ABSTRACT

A glass substrate includes a first major surface, a second major surface, an end surface, a first boundary surface, a second boundary surface, and a bent portion in which the first major surface is bent so as to be concave and the second major surface is bent so as to be convex. The bent portion includes a portion in which a distance $D_1$ from the end surface to the first major surface in a tangential direction, extending from the end surface toward the first major surface, of the glass substrate is longer than a distance $D_2$ from the end surface to the second major surface in a tangential direction, extending from the end surface toward the second major surface, of the glass substrate. A difference between the distance $D_1$ and the distance $D_2$ is 50 μm or larger.

8 Claims, 2 Drawing Sheets

(51) Int. Cl.
  *C03C 17/34* (2006.01)
  *C03C 21/00* (2006.01)
  *H05K 5/03* (2006.01)

(52) U.S. Cl.
  CPC ........ *C03C 21/002* (2013.01); *C03C 2217/73* (2013.01)

(56) References Cited

U.S. PATENT DOCUMENTS

| | | | |
|---|---|---|---|
| 2019/0001637 A1* | 1/2019 | Ito | B32B 27/08 |
| 2019/0094604 A1 | 3/2019 | Inoue et al. | |
| 2019/0101787 A1 | 4/2019 | Inoue et al. | |

FOREIGN PATENT DOCUMENTS

| | | |
|---|---|---|
| JP | 2018-189996 A | 11/2018 |
| JP | 2019-010871 A | 1/2019 |
| TW | 201838948 A | 11/2018 |
| WO | WO-2016/027812 A1 | 2/2016 |
| WO | WO-2017/208995 A1 | 12/2017 |
| WO | WO-2018/117078 A1 | 6/2018 |
| WO | WO-2019/103469 A1 | 5/2019 |

OTHER PUBLICATIONS

International Searching Authority, "International Search Report," issued in connection with International Patent Application No. PCT/JP2020/023442, dated Aug. 25, 2020.

International Searching Authority, "Written Opinion," issued in connection with International Patent Application No. PCT/JP2020/023442, dated Aug. 25, 2020.

European Extended Search Report issued in corresponding European Patent Application No. 20826214.7 dated Nov. 6, 2023 (8 pages).

* cited by examiner

GLASS SUBSTRATE

CROSS-REFERENCE TO RELATED APPLICATIONS

This is a bypass continuation of International Patent Application No. PCT/JP2020/023442, filed on Jun. 15, 2020, which claims priority to Japanese Patent Application No. 2019-113466, filed on Jun. 19, 2019. The contents of these applications are hereby incorporated by reference in their entireties.

TECHNICAL FIELD

The present invention relates to a glass substrate.

BACKGROUND ART

An in-vehicle display device such as a car navigation device is installed in vehicles such as automobiles.

A cover member made of glass (cover glass) is used in in-vehicle display devices from the viewpoint of protecting a display panel (refer to Patent literatures 1 and 2, for example).

CITATION LIST

Patent Literature

Patent literature 1: WO 2016/027812
Patent literature 2: WO 2017/208995

SUMMARY OF INVENTION

Technical Problem

In the following, for the sake of convenience, one of the two major surfaces of a glass substrate that is used as a cover glass is referred to as a "first major surface" and the major surface opposite to the first major surface is referred to as a "second major surface."

The first major surface is a major surface that is located on the side of a user such as a driver who uses an in-vehicle display device (hereinafter simply referred to as a "user"). The second major surface is a major surface that is located on the side of a display panel.

An outer peripheral portion of the second major surface may be provided with a frame-shaped printed portion (refer to Patent literature 1). The printed portion hides wiring cables etc. arranged around the display screen (display area) of the display panel so that the user cannot see them from the side of the first major surface.

Usually, end portions of a glass substrate are formed with what is called chamfered portions (refer to Patent document 2). The surfaces of the chamfered portions are not provided with a printed portion.

Thus, there is a case where light generated on the side of the second major surface passes through the chamfered portions and portions around them, causing the user existing on the side of the first major surface to feel that "the chamfered portions are emitting light and hence are dazzling." This phenomenon is hereinafter referred to as "light emission from chamfered portions." Where the user is, for example, a driver, the light emission from chamfered portions may cause trouble in driving.

There is a recent trend that part of a cover glass is bent so as to conform to, for example, the shape of an in-vehicle display device. That is, a glass substrate used as a cover glass may have a bent portion in addition to a flat portion (i.e., a portion that is not bent). In the bent portion, for example, the first major surface is bent so as to be concave and the second major surface is bent so as to be convex.

Usually, the user sees the glass substrate (cover glass) from such a position as to be opposed to its flat portion. At this time, even if the flat portion is free of light emission from chamfered portions, light emission from chamfered portions may occur in the bent portion which is different from the flat portion in shape.

The present has been made in view of the above points, and an object of the invention is to provide a glass substrate in which light emission from chamfered portions is suppressed in a bent portion.

Solution to Problem

After making diligent studies, the present inventors have found that the above object can be attained by employing the following configurations and thus completed the invention.

That is, the invention provides glass substrates of the following items [1] to [10]:

[1] A glass substrate comprising a first major surface, a second major surface which is opposite to the first major surface; an end surface interposed between the first major surface and the second major surface; a first boundary surface which is connected to the first major surface and the end surface; a second boundary surface which is connected to the second major surface and the end surface; and a bent portion in which the first major surface is bent so as to be concave and the second major surface is bent so as to be convex, wherein the bent portion includes a portion in which a distance $D_1$ from the end surface to the first major surface in a tangential direction, extending from the end surface toward the first major surface, of the glass substrate is longer than a distance $D_2$ from the end surface to the second major surface in a tangential direction, extending from the end surface toward the second major surface, of the glass substrate and a difference between the distance $D_1$ and the distance $D_2$ is 50 μm or larger.

[2] The glass substrate according to item [1], wherein in the bent portion a printed portion is provided on the second major surface and a distance $D_3$ from the printed portion to the second boundary surface in the tangential direction, extending from the end surface toward the second major surface, of the glass substrate is 150 μm shorter.

[3] The glass substrate according to item [1] or [2], further comprising, in addition to the bent portion, a flat portion in which the first major surface and the second major surface are flat surfaces.

[4] The glass substrate according to item [3], wherein, in the flat portion, the distance $D_1$ is equal to the distance $D_2$.

[5] The glass substrate according to any one of items [1] to [4], further comprising a functional layer on the first major surface and the first boundary surface in the bent portion.

[6] The glass substrate according to any one of items [1] to [5], wherein in the bent portion the distance $D_1$ is 250 μm or longer.

[7] The glass substrate according to any one of items [1] to [6], wherein in the bent portion the ratio of the distance $D_1$ to a length $L_1$ of the first major surface is 0.250% or larger. The length $L_1$ is a length along an extension line of the distance $D_1$.

[8] The glass substrate according to any one of items [1] to [7], wherein the first boundary surface and the second boundary surface are flat surfaces.

[9] The glass substrate according to any one of items [1] to [8], wherein the glass substrate is used as a cover glass of a display device.

[10] The glass substrate according to item [9], wherein the display device is an in-vehicle display device.

Advantageous Effect of Invention

The invention can provide a glass substrate in which light emission from chamfered portions is suppressed in a bent portion.

DESCRIPTION OF EMBODIMENT

A preferred embodiment of the present invention will be hereinafter described with reference to FIG. 1 to FIG. 3.

However, the invention is not limited to the following embodiment. Various changes and replacements can be made of the following embodiment without departing from the spirit and scope of the invention.

Glass Substrate

First, a glass substrate 1 is described with reference to FIG. 1 and FIG. 2.

Figure 1:
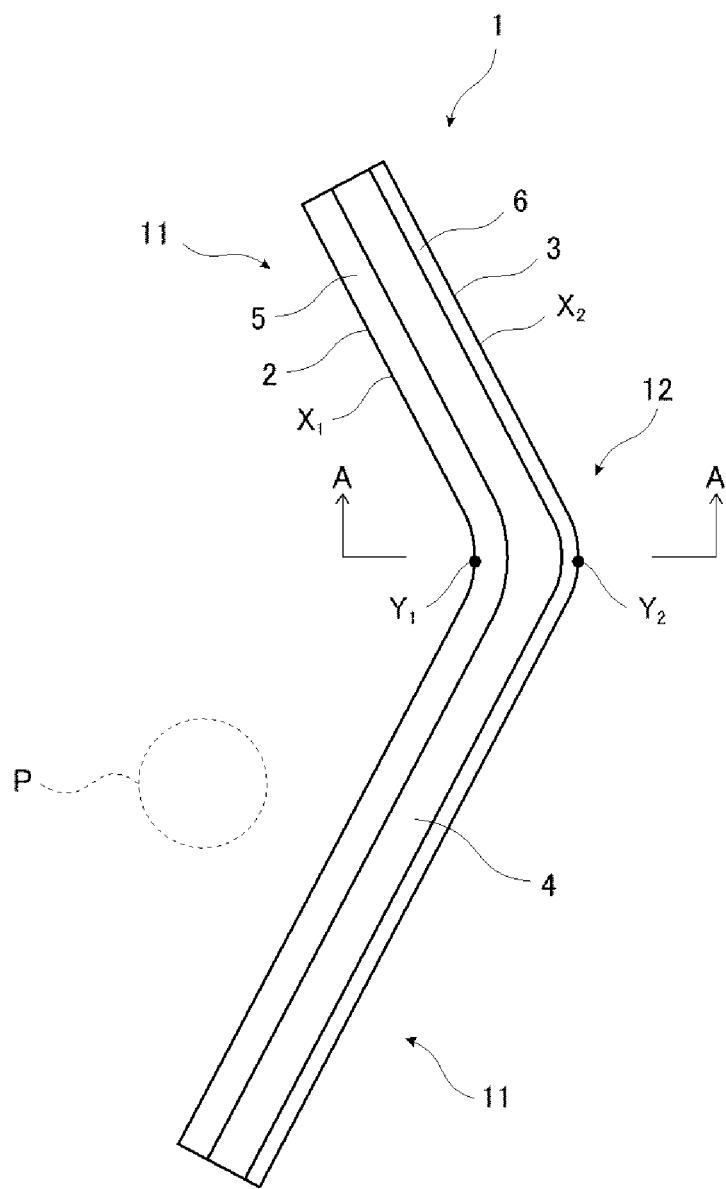
FIG. 1 is a top view of a glass substrate.

FIG. 1 is a top view of the glass substrate 1. An example case that the glass substrate 1 is used as a cover glass of an in-vehicle display device (not shown) is described below. However, the glass substrate 1 can also be used as a cover glass of display devices other than in-vehicle display devices.

First Major Surface and Second Major Surface

As shown in FIG. 1, the glass substrate 1 is a plate-shaped glass having a pair of major surfaces, that is, a first major surface 2 and a second major surface 3 which is opposite to the first major surface 2. Neither a printed portion 7 nor a functional layer 8 (described later) is shown in FIG. 1.

The first major surface 2 is a major surface that is located on the side of a user such as a driver who uses the in-vehicle display device (hereinafter simply referred to as a "user"). The second major surface 3 is a major surface that is located on the side of a display panel (not shown) of the in-vehicle display device.

Flat Portions and Bent Portion

As shown in FIG. 1, at least part of the glass substrate 1 is bent, that is, the glass substrate 1 has flat portions 11 and a bent portion 12.

In the flat portions 11, the first major surface 2 and the second major surface 3 are flat surfaces.

In the bent portion 12, the first major surface 2 is bent (curved) so as to be concave and the other major surface, that is, the second major surface 3, is bent (curved) so as to be convex.

The radius of curvature of the bent portion 12 is, for example, 10 mm or larger and 1,000 mm or smaller, preferably 20 mm or larger and 800 mm or smaller and even preferably 30 mm or larger and 600 mm or smaller.

First Boundary Surface, Second Boundary Surface, and End Surfaces

Figure 2:
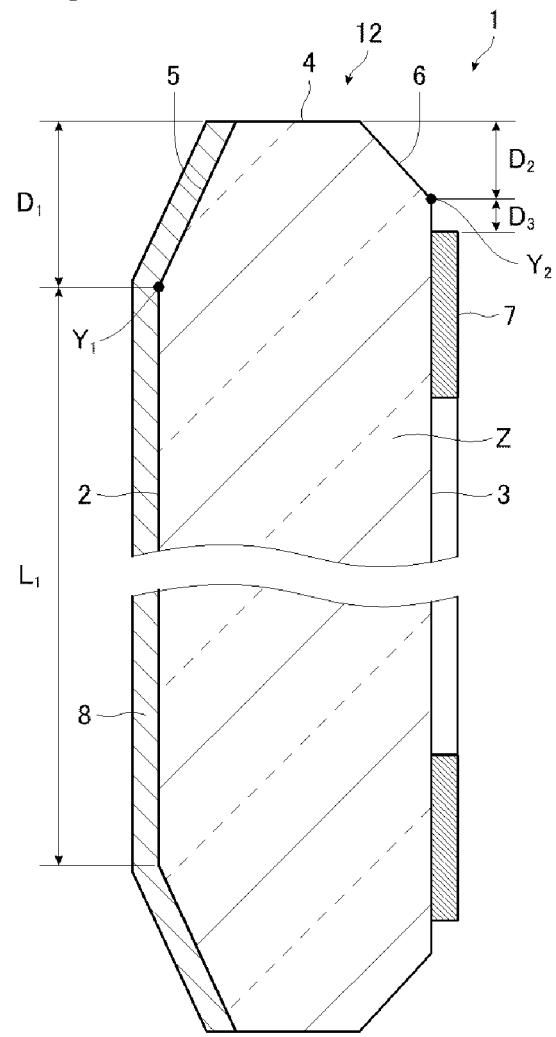
FIG. 2 is a sectional view taken along line A-A in FIG. 1 and is a sectional view of the bent portion of the glass substrate.

FIG. 2 is a sectional view taken along line A-A in FIG. 1 and is a sectional view of the bent portion 12 of the glass substrate 1.

As shown in FIG. 2, the glass substrate 1 has an end surface 4 which is interposed between the first major surface 2 and the second major surface 3.

Furthermore, the bent portion 12 of the glass substrate 1 has a first boundary surface 5 which is connected to the first major surface 2 and the end surface 4 and a second boundary surface 6 which is connected to the second major surface 3 and the end surface 4.

Although in FIG. 2 the end surface 4, the first boundary surface 5, and the second boundary surface 6 are drawn as flat surfaces, their shapes are not limited to flat surfaces and may be curved surfaces that are curved so as to be convex, for example. Furthermore, the end surface 4 may be shaped so as to have no flat portion like a round chamfered shape. In this case, the term "end surface" should be read as an "apex portion."

It is preferable that the surface roughness Sa (arithmetic average height) of the first boundary surface 5 be 0.02 μm or higher because in that case a functional layer 8 (described later) is made high in durability, even preferably 0.05 μm or higher and further preferably 0.1 μm or higher. There are no particular limitations on the upper limit on the surface roughness Sa of the first boundary surface 5; for example, it should be 1 μm or lower, preferably 0.5 μm or lower.

There are no particular limitations on the surface roughness Sa of the second boundary surface 6; it may be the same as the surface roughness Sa of the first boundary surface 5.

Surface roughness Sa is measured according to ISO 25178.

In the following, the first boundary surface 5 and the second boundary surface 6 in the bent portion 12 of the glass substrate 1 may be referred to together as "chamfered portions."

It is preferable that first boundary surface 5 and second boundary surface 6 be also formed in the flat portions 11 (see FIG. 1) of the glass substrate 1.

Printed Portion

As shown in FIG. 2, the printed portion 7 which is made of black ink, for example, is provided on the second major surface 3. The printed portion 7 is a frame-shaped member that is provided on an outer peripheral portion of the second major surface 3 using a screen printing machine or an ink jet machine.

As described above, the display panel is disposed on the side of the second major surface 3 of the glass substrate 1. The printed portion 7 hides wiring cables etc. arranged around the display screen (display area) of the display panel so that the user cannot see them from the side of the first major surface 2.

As shown in FIG. 2, usually, in many cases, no part of the printed portion 7 is formed on the second boundary surface 6 (chamfered portion) of the glass substrate 1.

Thus, light generated on the side of the second major surface 3 of the glass substrate 1 may pass through the chamfered portions (second boundary surfaces 6 and first boundary surfaces 5) and portions around them and, as a result, causes the user existing on the side of the first major surface 2 of the glass substrate 1 to feel that "chamfered portions are emitting light and hence are dazzling." That is, "light emission from chamfered portions" may occur.

For example, light emission from chamfered portions occurs in the following manner.

Sunlight enters the in-vehicle display device (not shown) from the side of the first major surface 2 of the glass substrate 1, passes through or by the chamfered portions (first boundary surfaces 5 and second boundary surfaces 6) of the glass substrate 1, and is reflected by a housing (not shown) disposed on the side of the second major surface 3. Resulting reflection light passes through the vicinity of the chamfered portions (second boundary surfaces 6 and first boundary surfaces 5) of the glass substrate 1 from the second major surface 3 to the first major surface 2, causing light emission from chamfered portions.

The boundary between the first major surface 2 and the first boundary surface 5 is in many cases a ridge line (hereinafter also referred to as "ridge line portion"). Reflection light may be scattered by the ridge line portion when it passes through the chamfered portions and portions around them (in particular, ridge line portion) and may hit the eyes. In this case, the ridge line portion on the side of the first major surface 2 shines and sometimes dazzles the driver.

The user usually sees the glass substrate 1 (cover glass) from a position P (see FIG. 1) that is opposed to a flat portion 11. At this time, even if no light emission from chamfered portions is occurring in the flat portion 11, light emission from chamfered portions may occur in the bent portion 12 that is different from the flat portion 11 in shape.

Distance $D_1$ and Distance $D_2$

In view of the above, in the embodiment, as shown in FIG. 2, the bent portion 12 of the glass substrate 1 includes a portion (for the sake of convenience, hereinafter referred to as "particular portion") in which the distance $D_1$ from end surface 4 to the first major surface 2 in a tangential direction, extending from the end surface 4 toward the first major surface 2, of the glass substrate 1 (i.e., in the extension direction of the bent portion 12) is longer than the distance $D_2$ from the end surface 4 to the second major surface 3 in a tangential direction, extending from the end surface 4 toward the second major surface 3, of the glass substrate 1 (i.e., in the extension direction of the bent portion 12) and the difference between the distance $D_1$ and the distance $D_2$ is 50 μm or larger.

With this measure, the printed portion 7 is formed at position that is closer to the end surfaces 4 than in a case that the distance $D_2$ is equal to the distance $D_1$ in the entire bent portion 12. As a result, a larger portion is covered on the side (i.e., the side of the second major surface 3) opposite to each first boundary surface 5. In particular, the ridge line portion on the side of the first major surface 2 is covered with the printed portion 7 in a top view of the glass substrate 1. In this manner, the amount of light that comes from the side of the second major surface 3 and passes through each chamfered portion (second boundary surface 6 and first boundary surface 5) and a portion around it, in particular, each ridge line portion, can be suppressed. That is, the light emission from chamfered portions can be suppressed.

The bent portion 12 may include a portion that is not the particular portion as mentioned above (e.g., a portion where the difference between the distance $D_1$ and the distance $D_2$ is not larger or equal to 50 μm).

Because the light emission from chamfered portions in the bent portion 12 can be suppressed more, it is preferable that the difference between the distance $D_1$ and the distance $D_2$ in the particular portion of the bent portion 12 be 70 μm or larger, even preferably 150 μm or larger. There are no particular limitations on the upper limit; for example, it is preferable that the difference be 300 μm or smaller, even preferably 250 μm or smaller.

Because the durability of the functional layer 8 (described later) is made higher, it is preferable that the distance $D_1$ in the bent portion 12 (in particular, in the above-mentioned particular portion) be 150 μm or larger, even preferably 250 μm or larger and further preferably 300 μm or larger. There are no particular limitations on the upper limit; for example, it is preferable that the distance $D_1$ in the bent portion 12 be 1 mm or smaller, even preferably 750 μm or smaller and further preferably 500 μm or smaller.

Because the durability of the functional layer 8 (described later) is made higher, in the bent portion 12 (in particular, in the above-mentioned particular portion), it is preferable that the ratio, $(D_1/L_1) \times 100$, of the distance $D_1$ (unit: μm) to the length $L_1$ (unit: μm) of the first major surface 2 in a tangential direction, extending from the end surface 4 of the glass substrate 1 toward the first major surface 2, of the first major surface 2 be large. More specifically, the ratio of the distance $D_1$ to the length $L_1$ of the first major surface 2 be 0.250% or larger, even preferably 0.290% or larger and further preferably 0.320% or larger. There are no particular limitations on the upper limit; for example, the ratio should be 0.500% or smaller. The length $L_1$ of the first major surface 2 is also the length along an extension line of the distance $D_1$.

In the flat portion 11 (see FIG. 1) of the glass substrate 1, the distance $D_1$ (hereinafter the distance $D_1$ is also be referred to as the "length of each first boundary surface 5") and the distance $D_2$ (hereinafter the distance $D_2$ is also be referred to as the "length of each second boundary surface 5") need not always be different from each other (and they may be the same unlike in the bent portion 12. The term "same" means that they coincide with each other in a sense that a working error is included. For example, the term "working error" means an error that is smaller than or equal to 5% of the distance $D_1$ or the distance $D_2$; it is preferable that the working error be 3% or smaller and even preferably 1% or smaller. Or the term "working error" means such an error that the difference between the distance $D_1$ and the distance $D_2$ is 30 μm or smaller; it is preferable that the working error be 10 μm or smaller.

It is preferable that in the flat portion 11 of the glass substrate 1, the distance $D_1$ be equal to the distance $D_2$ because this provides good appearance.

Where the glass substrate 1 has plural flat portions 11, each of the distance $D_1$ and the distance $D_2$ may either vary or do not vary from one flat portion 11 to another. Each of the distance $D_1$ and the distance $D_2$ not varying from one flat portion 11 to another is preferable because in that case good appearance is obtained and the productivity is made high.

Distance $D_3$

It is preferable that in the bent portion 12 (in particular, in the particular portion mentioned above) the distance $D_3$ from the printed portion 7 provided on the second major surface 3 to the second boundary surface 6 in a tangential direction, extending from the end surface 4 toward the second major surface 3, of the glass substrate 1 (i.e., in the extension direction of the bent portion 12) be shorter because in that case the light emission from chamfered portions is suppressed more, as shown in FIG. 2. More specifically, it is preferable that the distance $D_3$ be 150 μm or shorter, even preferably 120 μm or shorter and further preferably 100 μm or shorter.

Part of the printed portion 7 may be formed on the second boundary surface 6.

Distances $D_1$, $D_2$, and $D_3$ are measured by observing the glass substrate 1 using a microscope ("MS100" produced by Asahi Kougakuki Manuf. Co., Ltd.) at a magnification of ×20.

The distances $D_1$, $D_2$, and $D_3$ are defined as follows. Refer to FIGS. 1 and 2.

Let $Y_1$ represent an arbitrary point on an intersection line $X_1$ of the first major surface 2 and a first boundary surface 5. Let Z represent a cross section (plane) that includes the point $Y_1$, intersects the intersection line $X_1$ perpendicularly, and extends in the extension direction of the bent portion 12. The cross section Z is also a plane that is perpendicular to a tangential line of the intersection line $X_1$ at the point $Y1$. The distance $D_1$ is defined as a longest distance from the point $Y_1$ to the end surface 4 in the direction parallel with the first major surface 2 in the cross section Z.

Then Let $Y_2$ represent a point that is on an intersection line $X_2$ of the second major surface 3 and a second boundary surface 6 and is in the cross section Z. The distance $D_2$ is defined as a longest distance from the point $Y_2$ to the end surface 4 in the direction parallel with the second major surface 3 in the cross section Z.

The expression "longest distance" is used above because there is a case where the end surface 4 is a curved surface and hence a boundary line between the end surface 4 and the first boundary surfaces 5 or the second boundary surface 6 is unclear.

The distance D3 is defined as a shortest distance between the point $Y_2$ and the printed portion 7 in the direction parallel with the second major surface 3 in the cross section Z. The expression "shortest distance" is used here because the end face of the printed portion 7 may have a swell or the like.

Chemically Strengthened Glass

When used as a cover glass, it is preferable that the glass substrate 1 be glass (chemically strengthened glass) that has been subjected to chemically strengthening treatment.

A compressive stress layer is formed in a surface layer of chemically strengthened glass.

It is preferable that the depth (DOL) of the compressive stress layer be 10 μm or larger, even preferably 15 μm or larger and further preferably 25 μm or larger.

It is preferable that a compressive stress value (CS) of the compressive stress layer be 500 MPa or larger, even preferably 650 MPa or larger and further preferably 750 MPa or larger. On the other hand, it is preferable that the compressive stress value (CS) of the compressive stress layer be 1,200 MPa or smaller.

A compressive stress value (CS) of a compressive stress layer and a depth (DOL) of the compressive stress layer are measured using a surface stress meter ("FSM-6000" produced by Orihara Manufacturing Co., Ltd.).

Functional Layer

As shown in FIG. 2, a functional layer 8 may be provided on the first major surface 2 of the glass substrate 1. Examples of the functional layer 8 include an antireflection layer and an antifouling layer.

Where a functional layer 8 is provided on the first major surface 2 in the bent portion 12 of the glass substrate 1, the functional layer 8 may be provided so as to be also provided on the first boundary surface 5 continuously with its portion provided on the first major surface 2 as shown in FIG. 2.

Haze

It is preferable that the haze of the glass substrate 1 be 30% or lower, even preferably 10% or lower.

Haze is transmission haze as prescribed in JIS K 7136.

Plate Thickness, Shape, and Size

It is preferable that the thickness of the glass substrate 1 be 0.5 mm or larger and 2.5 mm or smaller, even preferably 0.7 mm or larger and 2.0 mm or smaller.

The shape and the size of each of the major surfaces (first major surface 2 and second major surface 3) of the glass substrate 1 is determined as appropriate according to the shape etc. of an in-vehicle display device used.

Manufacturing Method of Glass Substrate

Next, a method for manufacturing the above-described glass substrate 1 (for the sake of convenience, hereinafter also referred to as a "present manufacturing method") is described by also referring to FIG. 3.

Preparation of Glass Plate

Figure 3:
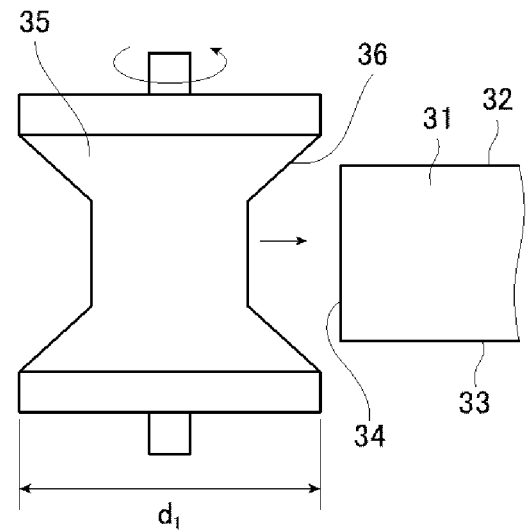
FIG. 3 is a sectional view illustrating how a glass plate is ground using a rotary whetstone.

First, as shown in FIG. 3, a glass plate 31 is prepared. The glass plate 31 has a first major surface 32 (one major surface), a second major surface 33 (the other major surface), and end surface 34 which is connected to the first major surface 32 and the second major surface 33.

The first major surface 32 of the glass plate 31 corresponds to a first major surface 2 of a glass substrate 1. The second major surface 33 of the glass plate 31 corresponds to a second major surface 3 of a glass substrate 1.

The thickness of the glass plate 31 is equal to that of the glass substrate 1.

The glass plate 31 has a bent portion (not shown) that is bent in the same manner as the bent portion 12 of the glass substrate 1.

A kind of glass of the glass plate 31 is, for example, soda-lime glass or aluminosilicate glass ($SiO_2$—$Al_2O_3$—$Na_2O$ glass).

Examples of the glass composition of the glass plate 31 include the glass compositions described in paragraph [0019] of JP-A-2019-006650.

Where the glass plate 31 is to be subjected to chemically strengthening treatment (described later), aluminosilicate glass-based glass for chemical strengthening ("Dragontrail" (registered trademark) produced by AGC Inc.), for example, is used preferably.

Grinding

FIG. 3 is a sectional view illustrating how the glass plate 31 is ground using a rotary whetstone 35.

As shown in FIG. 3, end portion of the glass plate 31 is then ground using a rotary whetstone 35. In this manner, what is called chamfering is performed on the glass plate 31.

A grinding surface 36 (outer circumferential surface) of the rotary whetstone 35 is formed with an annular grinding groove that extends in the circumferential direction. The grinding surface 36 contains abrasive grains made of alumina, silicon carbide, diamond, or the like. There are no particular limitations on the grain size (JIS R 6001) of abrasive grains; for example, it is selected from a range of #300 to #2000.

The rotary whetstone 35 grinds an end portion of the glass plate 31 by the grinding surface 36 by moving relative to (i.e., along) the end portion of the glass plate 31 while rotating about the center line of the rotary whetstone 35. Cooling liquid such as water may be used during the grinding.

For example, grinding is performed using a rotary whetstone 35 whose diameter $d_1$ is smaller than a radius of curvature of the glass plate 31. In this manner, first, the glass plate 31 is worked so that the distance $D_1$ (the length of a first boundary surface 5) is equal to the distance $D_2$ (the length of a second boundary surface 6) (a result is not shown).

Subsequently, only a portion to become a bent portion 12 is ground using a grinding tool (e.g., grinder) that is different from the rotary whetstone 35 so that the distance $D_1$ (the length of a first boundary surface 5) becomes longer than the distance $D_2$ (the length of a second boundary surface 6) (see FIG. 2).

As a result, a glass substrate 1 as described above is obtained.

A glass substrate 1 may be obtained by using only a rotary whetstone 35 without using another grinding tool such as a grinder.

In this case, the glass plate 31 is ground using a rotary whetstone 35 whose diameter $d_1$ is larger than usual relative to the radius of curvature of the glass plate 31. Such a rotary whetstone 35 can be acquired as, for example, a custom-made tool. As a result, the glass plate 31 is worked so that the distance $D_1$ (the length of a first boundary surface 5) becomes longer than the distance $D_2$ (the length of a second boundary surface 6) only in a portion to become a bent portion 12 (see FIG. 2).

Chemically Strengthening Treatment

Chemically strengthening treatment may be performed on the glass plate 31 that has been ground. In this case, the glass plate 31 that has been subjected to the chemically strengthening treatment becomes a glass substrate 1.

Where chemically strengthening treatment is performed, glass for chemical strengthening is used as the glass plate 31.

A method known in the art can be employed in the chemically strengthening treatment; typically, the glass plate 31 is immersed in molten salt. As a result, in a surface layer of the glass plate 31, alkali ions (Li ions and/or Na ions) are ion-exchanged for (replaced by) alkali ions of another or other kinds (Na ions and/or K ions) having a larger ion radius (or radii) in the molten salt. A layer in which compressive stress is produced by density increase (i.e., compressive stress layer) is formed in a surface layer of the glass plate 31 by the ion exchange. The glass plate 31 can be strengthened in this manner.

Where the alkali ions contained in the glass plate 31 are Na ions, it is preferable that the molten salt (inorganic salt composition) contain potassium nitrate ($KNO_3$).

Treatment conditions such as a temperature of the molten salt and an immersion time may be set so that the compressive stress value (CS) of a compressive stress layer, the thickness (DOL) of the compressive stress layer, etc. have desired values.

Formation of Functional Layer

Subsequently, a functional layer 8 such as an antireflection layer or an antifouling layer is formed optionally on the first major surface 2 of the thus-obtained glass substrate 1. For example, paint to become a functional layer 8 is applied to the first major surface 2 of the glass substrate 1 by a known method. As a result, a functional layer 8 is formed.

The above step may be executed by employing a method of flattening the glass substrate 1 having the bent portion 12 temporarily, forming a functional layer 8 by applying paint while maintaining that state, and then canceling the flattened state (refer to JP-T-2015-522506 (The symbol "JP-T" as used herein means a published Japanese translation of a PCT patent application.). For the sake of convenience, this method is hereinafter referred to as a "flattening method." In the flattening method, the original state of the glass substrate 1 is restored, that is, the first major surface 2 is bent so as to be concave upon the cancellation of the flattened state of the glass substrate 1.

Where a functional layer 8 is formed on the first major surface 2 using the flattening method, since the first major surface 2 is bent so as to be concave after formation of the functional layer 8, the functional layer 8 formed may be prone to peel off the first major surface 2 due to stress accumulation.

Thus, it is preferable to form the functional layer 8 continuously not only on the first major surface 2 but also on the first boundary surface 5 that is continuous with the first major surface 2 as shown in FIG. 2.

The functional layer 8 formed on the first major surface 2 and the first boundary surfaces 5 is less prone to peel off (i.e., higher in durability) than the functional layer 8 formed only on the first major surface 2. It is inferred that this is because the former functional layer 8 has a larger area than the latter functional layer 8 and the first boundary surfaces 5 provide an anchor effect.

Where the functional layer 8 is formed on the first major surface 2 and the first boundary surface 5, it is preferable that the surface roughness Sa of the first boundary surface 5, the distance D1 (the length of each first boundary surface 5), and the ratio of the distance $D_1$ to the length $L_1$ of the first major surface 2 in the bent portion 12 be in the above-described respective ranges. This increases the durability of the functional layer 8 in the bent portion 12.

EXAMPLES

The embodiment of the invention is hereinafter described in a specific manner using Inventive Examples etc. However, the invention is not limited to the following Examples. In the following description, Examples 1-5 are Working Examples and Example 6 is a Comparative Example.

Examples 1-6

"Dragontrail" produced by AGC Inc. was prepared as a glass plate 31 (see FIG. 3). The size of the major surfaces (first major surface 32 and second major surface 33) of the glass plate 31 was 800 mm×100 mm. The thickness of the glass plate 31 was 1.1 mm.

The glass plate 31 was bent at such a position as to be divided at a ratio 5:3 in the longitudinal direction in such a direction that the first major surface 32 became concave. A radius of curvature (unit: mm) of a portion to become a bent portion 12 is shown in Table 1 below.

An end portion of the prepared glass plate 31 was ground using a rotary whetstone 35. The diameter $d_1$ (unit: mm) of the rotary whetstone 35 is shown in Table 1 below. Then, in Examples 1-5, only a portion to become a bent portion 12 was ground using a grinder. Thus, a glass substrate 1 having a first boundary surface 5 and a second boundary surface 6 (see FIG. 1) was obtained.

A distance $D_1$ (a length of the first boundary surface 5), a distance $D_2$ (a length of the second boundary surface 6), and the difference between the distance $D_1$ and the distance $D_2$ in each of a flat portion 11 and the bent portion 12 of the glass substrate 1 obtained are shown in Table 1 below (unit: μm).

Furthermore, a length $L_1$ of a first major surface 2 (unit: mm) and the ratio of the distance $D_1$ to the length $L_1$ (unit: %) of the bent portion 12 of the glass substrate 1 obtained are shown in Table 1 below.

A frame-shaped printed portion 7 made of black ink was formed on an outer peripheral portion of the second major surface 3 of the glass substrate 1. A distance $D_3$ (unit: mm) from the printed portion 7 to the second boundary surface 6 in the bent portion 12 in a tangential direction, extending from the end surface 4 toward the second major surface 3, of the glass substrate 1 is shown in Table 1 below.

Following evaluations were performed on the glass substrates 1 of Examples 1-6.

Suppression of Light Emission from Chamfered Portion in Bent Portion

A metal plate (not shown) formed so as to have the same shape as the glass substrate 1 was disposed on the side of the second major surface 3 of the glass substrate 1 and the bent portion 12 of the glass substrate 1 was seen from a position P (see FIG. 1) that is opposed to the flat portion 11 in an environment of illuminance 1,500 lx.

"A" is written in Table 1 below when the chamfered portions (first boundary surfaces 5 and second boundary surfaces 6) did not shine, "B" is written when the chamfered portions shone but were not dazzling, and "C" is written when the chamfered portions shone and were dazzling. In the case of "A" or "B," it can be evaluated that the light emission from a chamfered portion is suppressed in the bent portion 12.

Durability of Functional Layer of Bent Portion

A functional layer 8 was formed on the first major surface 2 and the first boundary surface 5 of the glass substrate 1 by the flattening method according to the method described in JP-T-2015-522506.

More specifically, the glass substrate 1 having the bent portion 12 was flattened temporarily, a functional layer 8 was formed while that state was maintained, and then the flattened state was canceled. Upon the cancellation of the flattened state, the glass substrate 1 recovered and the first major surface 2 was bent again so as to be concave.

An antireflection layer and an antifouling layer were formed in the following manner as the functional layer 8.

First, a 13-nm-thick high refractive index layer (first layer) made of niobium oxide was formed by performing magnetron sputtering using a niobium oxide cylindrical target (product name: NBO target; produced by AGC ceramics Co., Ltd.) while introducing oxygen and argon into a vacuum chamber.

Then a 35-nm-thick low refractive index layer (second layer) made of silicon oxide was formed on the first layer by performing magnetron sputtering using a silicon cylindrical target (produced by AGC ceramics Co., Ltd.) while introducing oxygen and argon into the vacuum chamber.

Subsequently on the second layer, a 115-nm-thick high refractive index layer (third layer) made of niobium oxide was formed in the same manner as the first layer was formed. Furthermore, an 80-nm-thick low refractive index layer (fourth layer) made of silicon oxide was formed on the third layer in the same manner as the second layer was formed.

In this manner, an antireflection layer was formed in which a total of four layers were laid one on another in such a manner that a high refractive index layer made of niobium oxide and a low refractive index layer made of silicon oxide were formed alternately.

An antifouling layer was formed thereafter. First, a heating container containing "KY-185" (produced by Shin-Etsu Chemical Co., Ltd.) which is a material of an antifouling layer was heated to 270° C. Then the glass substrate 1 on which the antireflection layer was formed was set in a vacuum chamber. Then an antifouling layer was deposited by jetting its material onto the antireflection layer formed on the glass substrate 1 in the vacuum chamber from a nozzle that was connected to the heating container containing the material of the antifouling layer. The deposition was performed until the film thickness reached 4 nm while monitoring the film thickness by a crystal oscillator monitor that was set in the vacuum chamber. The glass substrate 1 was then taken out of the vacuum chamber.

In the above-described manner, the antireflection layer and the antifouling layer were formed as a functional layer 8 on the glass substrate 1.

Vibration of 100-150 Hz continued to be applied for one week to the glass substrate 1 on which the functional layer 8 was formed. Such vibration would cause sheering force between the functional layer 8 and the surface of the glass substrate 1 to render the functional layer 8 prone to peel off if its adhesion is weak. Subsequently, the functional layer 8 formed on the first major surface 2 and the first boundary surface 5 in the bent portion 12 was rubbed 100 times with a load of 200 g using steel wool #0000.

The rubbed portion was observed visually. "A" is written in Table 1 below when no change was found by the observation, "B" is written when several (smaller than 10) scratches were found, "C" is written when 10 or more scratches were found but the functional layer did not peel off, and "D" is written when the functional layer peeled off. In the case of "A," "B," or "C," it can be evaluated that the functional layer 8 in the bent portion 12 is high in durability.

TABLE 1

|  |  | Ex. 1 | Ex. 2 | Ex. 3 | Ex. 4 | Ex. 5 | Ex. 6 |
|---|---|---|---|---|---|---|---|
| Bent portion | Radius of curvature (mm) | 50 | 100 | 500 | 100 | 100 | 100 |
|  | Distance $D_1$ (length of first boundary surface) (μm) | 350 | 350 | 350 | 300 | 280 | 200 |

TABLE 1-continued

|  |  | Ex. 1 | Ex. 2 | Ex. 3 | Ex. 4 | Ex. 5 | Ex. 6 |
|---|---|---|---|---|---|---|---|
|  | Distance $D_2$ (length of second boundary surface) (μm) | 200 | 200 | 200 | 200 | 200 | 200 |
|  | $D_1$-$D_2$ (μm) | 150 | 150 | 150 | 100 | 80 | 0 |
|  | Length $L_1$ of first major surface (mm) | 100 | 100 | 100 | 100 | 100 | 100 |
|  | Ratio of distance $D_1$ to length $L_1$ | 0.350% | 0.350% | 0.350% | 0.300% | 0.280% | 0.200% |
|  | Distance $D_3$ (μm) | 100 | 100 | 100 | 100 | 100 | 100 |
| Flat portion | Distance $D_1$ (length of first boundary surface) (μm) | 200 | 200 | 200 | 200 | 200 | 200 |
|  | Distance $D_2$ (length of second boundary surface) (μm) | 200 | 200 | 200 | 200 | 200 | 200 |
|  | $D_1$-$D_2$ (μm) | 0 | 0 | 0 | 0 | 0 | 0 |
| Diameter $d_1$ of rotary whetstone (mm) |  | 10 | 20 | 35 | 18 | 16 | 20 |
| Suppression of light emission from chamfered portion in bent portion |  | A | A | A | B | B | C |
| Durability of functional layer in bent portion |  | A | A | A | B | C | D |

Summary of Evaluation Results

As seen from Table 1 above, the light emission from a chamfered portion of the bent portion 12 was suppressed more in Examples 1-5 in which in the bent portion 12 the distance $D_1$ was longer than the distance $D_2$ and the difference between the distance $D_1$ and the distance $D_2$ was in a range of 80 to 150 μm than in Example 6 in which the distance $D_1$ was equal to the distance $D_2$.

Comparison between Examples 1-5 showed that the "light emission from a chamfered portion" of the bent portion 12 is suppressed more as the difference between the distance $D_1$ and the distance $D_2$ increased.

Furthermore, Examples 1-5 were high in the durability of the functional layer 8 in the bent portion 12.

Although the invention has been described in detail with reference to the particular embodiment, it is apparent to those skilled in the art that various changes and modifications can be made without departing from the spirit and scope of the invention.

DESCRIPTION OF SYMBOLS

1: Glass substrate
2: First major surface
3: Second major surface
4: End surface
5: First boundary surface
6: Second boundary surface
7: Printed portion
8. Functional layer
11: Flat portion
12: Bent portion
31: Glass plate
32: First major surface of glass plate
33: Second major surface of glass plate
34: End surface of glass plate
35: Rotary whetstone
36: Grinding surface
$D_1$: Distance from end surface of glass substrate to first major surface in tangential direction, extending from end surface of glass substrate toward first major surface, of glass substrate
$D_2$: Distance from end surface of glass substrate to second major surface in tangential direction, extending from end surface toward second major surface, of glass substrate
$D_3$: Distance from printed portion to second boundary surface in tangential direction, extending from end surface toward second major surface, of glass substrate
$d_1$: Diameter of rotary whetstone
$L_1$: Length of first major surface
P: Position opposed to flat portion of glass substrate
$X_1$: Intersection line of first major surface and first boundary surface
$X_2$: Intersection line of second major surface and second boundary surface
$Y_1$: Point on intersection line of first major surface and first boundary surface
$Y_2$: Point on intersection line of second major surface and second boundary surface
Z: Cross section

The invention claimed is:

1. A glass substrate comprising:
a first major surface;
a second major surface which is opposite to the first major surface;
an end surface interposed between the first major surface and the second major surface;
a first boundary surface which is connected to the first major surface and the end surface;
a second boundary surface which is connected to the second major surface and the end surface;
a bent portion in which the first major surface is bent so as to be concave and the second major surface is bent so as to be convex;
a flat portion in which the first major surface and the second major surface are flat surfaces,
wherein:
the bent portion comprises a portion in which a distance $D_1$ from a plane including the end surface to the end of the first major surface at a point where the first major surface meets the first boundary surface in a direction orthogonal to the plane including the end surface, is longer than a distance $D_2$ from the plane including the end surface to the end of the second major surface at a point where the second major surface meets the second boundary surface in a direction orthogonal to the plane including the end surface;

a difference between the distance $D_1$ and the distance $D_2$ is 50 µm or larger; and in the flat portion, the distance $D_1$ is equal to the distance $D_2$, wherein in the bent portion, a ratio of the distance $D_1$ to a length $L_1$ of the first major surface is 0.350% or larger, where the length $L_1$ is a length along an extension line of the distance $D_1$.

2. The glass substrate according to claim 1, wherein in the bent portion, a printed portion is provided on the second major surface, and a distance $D_3$ from the printed portion to the second boundary surface from a point of the printed portion on the second major surface nearest the second boundary surface to the point where the second major surface meets the second boundary surface in the direction orthogonal to the plane including the end surface, is 150 µm or shorter.

3. The glass substrate according to claim 1, further comprising a functional layer on the first major surface and the first boundary surface in the bent portion.

4. The glass substrate according to claim 1, wherein in the bent portion, the distance $D_1$ is 250 µm or longer.

5. The glass substrate according to claim 1, wherein in the bent portion, a ratio of the distance $D_1$ to a length $L_1$ of the first major surface is 0.350% or larger and 0.500% or less, where the length $L_1$ is a length along an extension line of the distance $D_1$.

6. The glass substrate according to claim 1, wherein the first boundary surface and the second boundary surface are flat surfaces.

7. The glass substrate according to claim 1, wherein the glass substrate is a cover glass of a display device.

8. The glass substrate according to claim 7, wherein the display device is an in-vehicle display device.

* * * * *